(12) United States Patent
Mizumura

(10) Patent No.: US 10,208,373 B2
(45) Date of Patent: *Feb. 19, 2019

(54) PRODUCTION METHOD FOR DEPOSITION MASK

(71) Applicant: V TECHNOLOGY CO., LTD., Yokohama-shi (JP)

(72) Inventor: Michinobu Mizumura, Yokohama (JP)

(73) Assignee: V TECHNOLOGY CO., LTD., Yokohama-shi (JP)

( * ) Notice: Subject to any disclaimer, the term of this patent is extended or adjusted under 35 U.S.C. 154(b) by 16 days.

This patent is subject to a terminal disclaimer.

(21) Appl. No.: 14/714,175

(22) Filed: May 15, 2015

(65) Prior Publication Data
US 2015/0259780 A1     Sep. 17, 2015

Related U.S. Application Data

(63) Continuation of application No. PCT/JP2013/079305, filed on Oct. 29, 2013.

(30) Foreign Application Priority Data

Nov. 15, 2012  (JP) .................................. 2012-250974

(51) Int. Cl.
  *B23K 26/03* (2006.01)
  *B23K 26/066* (2014.01)
  (Continued)

(52) U.S. Cl.
  CPC .......... *C23C 14/042* (2013.01); *B23K 26/032* (2013.01); *B23K 26/066* (2015.10);
  (Continued)

(58) Field of Classification Search
  CPC ... C23C 14/042; C23C 14/048; C23C 16/042; B23K 26/066; B23K 26/0661; B23K 26/032
  (Continued)

(56) References Cited

U.S. PATENT DOCUMENTS

2007/0000884 A1*  1/2007  Salama .............. B23K 26/0622
                                                                            219/121.68
2011/0259631 A1   10/2011  Rumsby
2014/0377903 A1* 12/2014  Takeda .................. C23C 14/042
                                                                            438/99

FOREIGN PATENT DOCUMENTS

CN              1800970 A      7/2006
CN            102318451 A      1/2012
                (Continued)

OTHER PUBLICATIONS

Machine Translation of WO-2013039196-A1.*
(Continued)

*Primary Examiner* — Dah-Wei D. Yuan
*Assistant Examiner* — Jose Hernandez-Diaz
(74) *Attorney, Agent, or Firm* — Morgan, Lewis & Bockius LLP

(57) ABSTRACT

A production method for a deposition mask is provided. The production method includes the steps of: forming a mask member having a structure in which a thin-board magnetic metal member having a through hole and a resin film contact tightly with each other; forming a mark that has a specified depth by irradiating a part of the film through the through hole of the mask member with laser beams; and forming an opening pattern that penetrates the film by irradiating a predetermined position with laser beams, using the mark as a reference.

6 Claims, 7 Drawing Sheets

(51) Int. Cl.
   *C23C 14/04* (2006.01)
   *C23C 16/04* (2006.01)
   *B05B 15/00* (2018.01)

(52) U.S. Cl.
   CPC .......... *C23C 14/048* (2013.01); *C23C 16/042* (2013.01); *B05B 15/00* (2013.01)

(58) Field of Classification Search
   USPC ................. 427/555, 596; 118/504; 430/4, 5
   See application file for complete search history.

(56) References Cited

FOREIGN PATENT DOCUMENTS

| | | |
|---|---|---|
| JP | 09-143677 A1 | 6/1997 |
| JP | 2001-237072 A | 8/2001 |
| JP | 2004-190057 A | 7/2004 |
| JP | 2006-188748 A | 7/2006 |
| JP | 2008-24956 | 2/2008 |
| JP | 2012-077328 A | 4/2012 |
| JP | 2012-220923 A | 11/2012 |
| TW | 201243523 A | 11/2012 |
| WO | WO-2013039196 A1 * 3/2013 ............. H05B 33/10 |
| WO | 2013/089138 A1 | 6/2013 |
| WO | 2013/105643 A1 | 7/2013 |
| WO | WO 2013105643 A1 * 7/2013 ........... C23C 14/042 |

OTHER PUBLICATIONS

International Preliminary Report on Patentability dated May 28, 2015, which issued in PCT/JP2013/079305; and English language translation thereof.

Taiwanese Office Action dated Dec. 7, 2016, which issued in Taiwanese Application No. 102141382 and its English translation.

Chinese Office Action dated Aug. 30, 2016, which issued in Chinese Application No. 201380058995.0, together with an English language translation thereof.

* cited by examiner

PRODUCTION METHOD FOR DEPOSITION MASK

CROSS-REFERENCE TO RELATED APPLICATION

This application is a continuation application of PCT/JP2013/079305, filed on Oct. 29, 2013.

BACKGROUND OF THE INVENTION

1. Field of the Invention

The present invention relates to a production method for a complex-type deposition mask in which a thin-board magnetic metal member supports a resin film that is subjected to laser beam machining to form multiple opening patterns therein at positions corresponding to a thin film pattern, and in particular, relates to a production method for a deposition mask, capable of improving formation position precision of the multiple opening patterns.

2. Description of Related Art

A conventional production method for a deposition mask has included: forming a first resist pattern that has multiple through holes on a metal plate; forming multiple opening patterns that penetrate the metal plate by carrying out an etching treatment via the through holes of the first resist pattern; subsequently, removing the first resist pattern; forming, on the metal plate, a second resist pattern that has multiple second through holes each of which exposes a metal marginal part with a predetermined width around each of the multiple opening patterns; carrying out an etching treatment via the second through holes of the second resist pattern so as to form a mask main body around each of the multiple through holes and a peripheral part which is positioned around the mask main body and has a thickness greater than that of the mask main body; and thereafter, removing the second resist pattern (for example, see Japanese Patent Application Laid-open Publication No. 2001-237072).

SUMMARY OF THE INVENTION

However, in such a conventional production method for a deposition mask, since the metal plate is subjected to the wet etching treatment so as to form the multiple opening patterns that penetrate the metal plate, the opening patterns with high precision cannot be formed accurately due to isotropy of the wet etching. In particular, in a case of producing the deposition mask for, for example, an organic electroluminescence display panel with a large area whose length of one side is several tens of centimeters, the opening patterns cannot be formed uniformly in a whole surface of the mask due to the generation of etching unevenness.

Thus, the Applicant suggests a complex-type deposition mask including: a resin film in which an opening pattern having a shape and dimensions that are the same as those of a thin film pattern is formed at a position corresponding to the thin film pattern to be formed in a substrate; and a thin-board magnetic metal member in which a through hole including the opening pattern is formed, the resin film and the magnetic metal member contacting tightly with each other.

The above-described complex-type deposition mask is obtained by carrying out laser beam machining with respect to a thin resin film having a thickness of about 10 μm to about 30 μm so as to form the opening patterns therein, which has an advantage that the opening patterns with high precision can be formed accurately, and even in the case of forming the deposition mask with a large area as described above, the opening patterns can be formed uniformly in the whole surface of the mask.

In this case, since the film is subjected to the laser beam machining so as to form the opening patterns therein, a part of the deposition mask which is subjected to the laser beam machining and a surrounding part thereof may be risen due to an impact of irradiation energy of laser beams L when the opening pattern penetrates the film, whereby positions of these parts may be displaced. Thus, in the case of forming the multiple opening patterns while moving a stage on which the deposition mask is placed and a laser emission optical system step by step relatively at specified intervals, formation positions of the respective opening patterns may be displaced.

Accordingly, in order to solve the above-described problems, the present invention aims to provide a production method for a deposition mask, capable of improving formation position precision of the multiple opening patterns.

In order to attain the object, a production method for a deposition mask of the present invention is a production method for a complex-type deposition mask including: a resin film in which at least one opening pattern having a shape and dimensions that are the same as those of a thin film pattern to be formed in a substrate is formed at a position corresponding to the thin film pattern; and a thin-board magnetic metal member in which at least one through hole sized to include the opening pattern is formed, the magnetic metal member contacting tightly with the resin film. The production method includes the steps of: forming a mask member having a structure in which the magnetic metal member having the through hole and the resin film before forming the opening pattern, contact tightly with each other; forming a mark that has a specified shape and a specified depth by irradiating a part of the film through the through hole of the mask member with laser beams; and forming the opening pattern that penetrates the film by irradiating a predetermined position with laser beams, using the mark as a reference.

According to the present invention, since the mark, serving as a formation target of the opening pattern, is formed to be shallow in depth in the film in advance, the mark can be formed with high positional precision without receiving the impact of the laser beam machining. Furthermore, even when the position of the mark is displaced due to the impact of the laser beam machining, the opening pattern can be formed while an imaging device detects the mark and corrects the positional displacement of the mark, and thus, the formation position precision of the opening pattern can be improved.

BRIEF DESCRIPTION OF THE DRAWINGS

FIGS. 2A and 2B are views illustrating a constitutional example of a deposition mask produced by the method of the present invention, in which FIG. 2A is a plan view, and FIG. 2B is a cross-sectional view taken in line O-O and viewed from arrows of FIG. 2A.

FIGS. 7A and 7B are views illustrating a further modified example of a deposition mask produced by the method of the present invention, in which FIG. 7A is a plan view, and FIG. 7B is a cross-sectional view.

DESCRIPTION OF PREFERRED EMBODIMENTS

Figure 1:
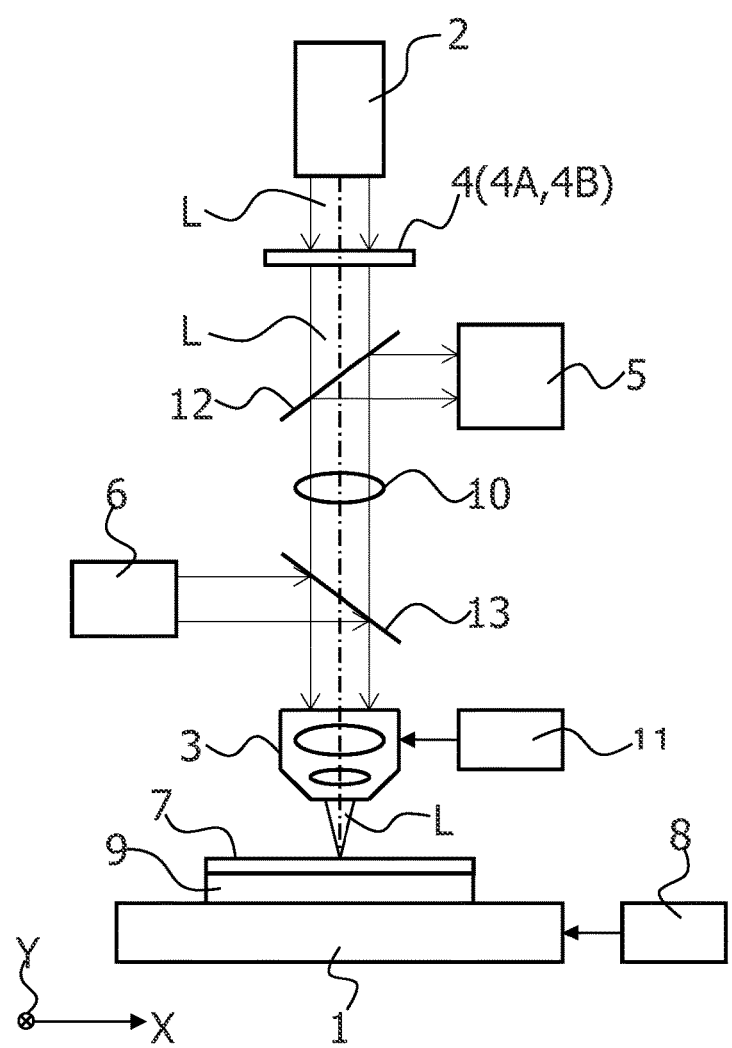
FIG. 1 is a front view illustrating an embodiment of a laser machining apparatus for use in a production method for a deposition mask of the present invention.

Hereinafter, an embodiment of the present invention will be described with reference to the accompanying drawings. FIG. 1 is a front view illustrating an embodiment of a laser machining apparatus for use in a production method for a deposition mask of the present invention. This laser machining apparatus is configured to form, in a resin film, an opening pattern having a shape and dimensions that are the same as those of a thin film pattern to be formed in a substrate at a position corresponding to the thin film pattern, and the laser machining apparatus is provided with an X-Y stage 1, a laser device 2, an object lens 3, a mask 4, an imaging device 5, and a illumination device 6.

On the X-Y stage 1, a mask member 7 including: a magnetic metal member in which a through hole sized to include the opening pattern is formed; and a resin film that can be permeated by visible light, the resin film contacting tightly with the magnetic metal member, is placed, and the X-Y stage 1 moves the mask member 7 step by step in X and Y directions and is provided with a first laser interferometer 8 for measuring a movement distance in the X and Y directions.

More specifically, the mask member 7 positioned and placed on a reference substrate 9 in which a reference mark serving as a reference for forming the opening pattern is formed in advance, is moved by the X-Y plate 1 together with the reference substrate 9 step by step.

Above the X-Y stage 1, the laser device 2 is disposed. This laser device 2 is configured to irradiate a film with the laser beams L with a wavelength of 400 nm or less, such as KrF 248 nm of excimer lasers or third harmonic generation or fourth harmonic generation of YAG lasers, whose cross section perpendicular to an optical axis is shaped to have a shape and dimensions that are the same as those of the thin film pattern, and whose energy density ranges from 1 J/cm$^2$ to 20 J/cm$^2$, so as to ablate the film, thereby forming the opening pattern. Moreover, the laser device 2 is provided with a beam expander that expands a size of the laser beams to a predetermined size.

On an optical path of the laser beams L, the object lens 3 is provided so that the object lens 3 faces the X-Y stage 1. This object lens 3 concentrates the laser beams L onto the film so as to subject the film to the laser beam machining. The object lens 3 is provided so that it can be moved vertically along the optical axis, and co-works with an imaging lens 10 so as to project an image of a through hole of the below-described mask 4 in reduced size onto the film, and the reference mark of the reference substrate 9 and a below-described mark serving as a formation target of the opening pattern to be formed on the film, are imaged on a photodetector surface of the below-described imaging device 5. Furthermore, a second laser interferometer 11 is attached to the object lens 3, whereby it is possible to measure a positional displacement amount of the object lens 3 in the X and Y directions based on a machine precision of a driving mechanism for moving the object lens 3 vertically.

Between the laser device 2 and the object lens 3 on the optical path of the laser beams L, the mask 4 is disposed detachably. This mask 4 includes: a first mask 4A in which a first through hole with a shape similar to that of the opening pattern to be formed in the film is formed; and a second mask 4B for forming the mark serving as the formation target of the opening pattern, and in which a second through hole with a shape similar to that of the mark is formed. The first through hole and the second through hole may be formed at positions separated from each other on the same mask 4, so that the first through hole and the second through hole may be switched to be used by sliding the mask 4 on a plane that is parallel with a X-Y plane.

On an optical path that is generated by branching the optical path which extends from the object lens 3 through the imaging lens 10 toward the mask 4 by a half mirror 12, the imaging device 5 is provided. This imaging device 5 is configured to detect the reference mark provided on the reference substrate 9 and the mark formed on the film, and the imaging device 5 is a two-dimensional CCD camera. Furthermore, an image forming position of the object lens 3, and a light receiving surface of the imaging device 5 and the mask 4 are arranged in conjugation.

On an optical path that is generated by branching the optical path which extends from the object lens 3 toward the imaging lens 10 by a half mirror 13, the illumination device 6 is provided. This illumination device 6 is configured to illuminate the reference mark provided on the reference substrate 9 and the mark formed on the film, so that the reference mark and the mark can be detected by the imaging device 5, and the illumination device 6 is a white light source such as a halogen lamp.

Next, a method for producing the deposition mask of the present invention by using the laser machining apparatus that is structured as described above will be described.

Figure 2A:
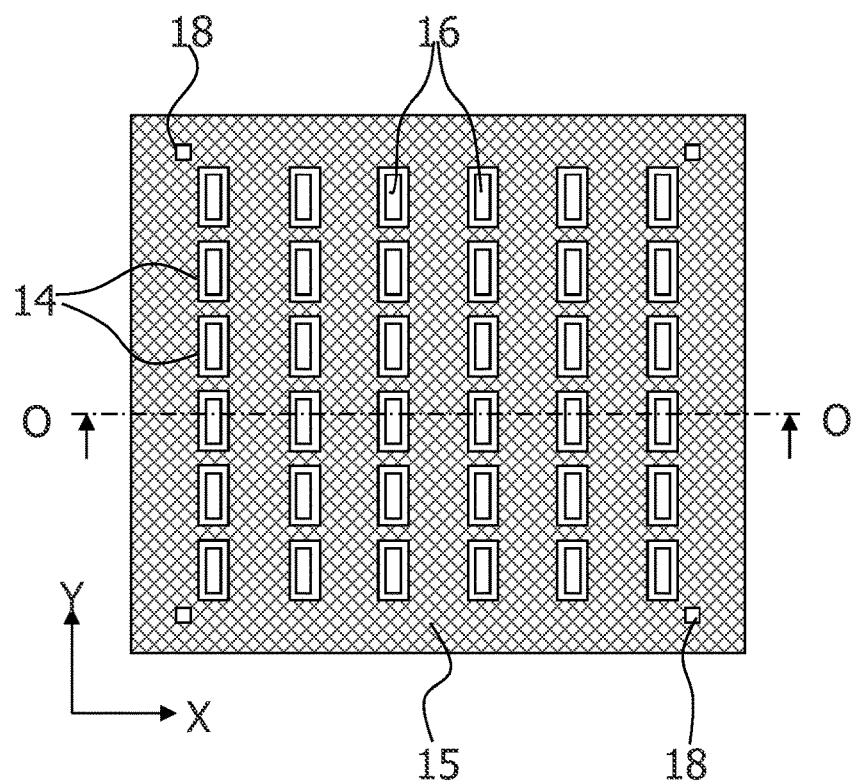
Figure 2B:
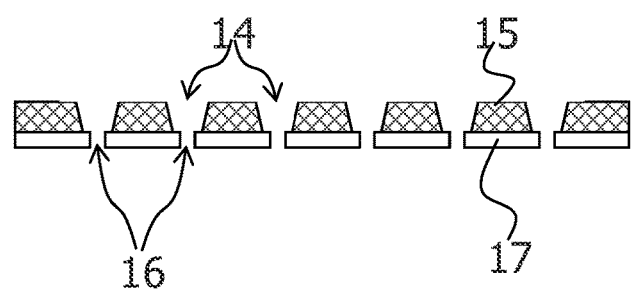

First, a process of forming the mask member 7 with a structure in which the magnetic metal member having the through hole and the resin film before forming the opening pattern, contact tightly with each other, will be described. Herein, the description will be provided in a case in which, as illustrated in FIGS. 2A and 2B, the deposition mask to be produced has a structure in which a magnetic metal member 15 and a film 17 contact tightly with each other. The magnetic metal member 15 has rectangular through holes 14 arranged in a matrix form and having a shape and dimensions greater than those of the thin film patterns, at the same array pitch as that of the multiple thin film patterns which are to be formed on the substrate, at positions corresponding to the thin film patterns, and the film 17 has opening patterns 16 arranged in a matrix form and having a shape and dimensions that are the same as those of the thin film patterns at the same array pitch as that of the thin film patterns, at positions corresponding to the multiple thin film patterns. In the figure, a reference symbol 18 denotes a mask-side alignment mark.

Figure 3A:
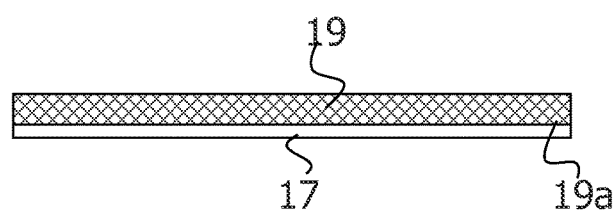
FIGS. 3A to 3C are explanatory views that illustrate a preceding process of the production method for the deposition mask of the present invention.
Figure 3B:
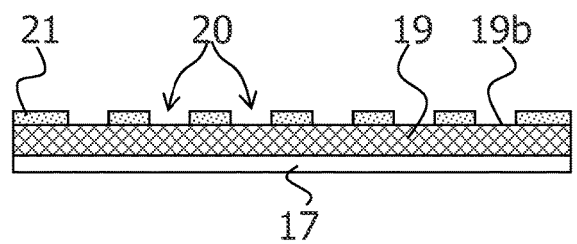
Figure 3C:
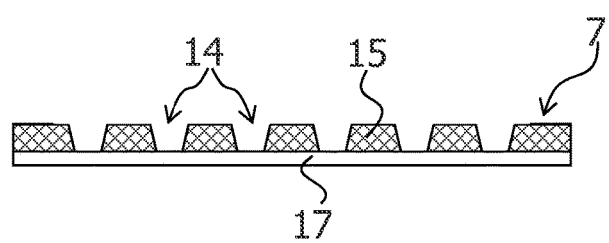

FIGS. 3A to 3C are explanatory views that illustrate a formation process of the mask member 7.

First, as illustrated in FIG. 3A, a magnetic metal sheet 19 of a magnetic metal material with a thickness of about 30 μm to about 50 μm, made of nickel, nickel alloy, Invar, Invar alloy, or the like, is cut off to have an area corresponding to a surface area of the substrate to be subjected to the deposition, and a resin liquid of polyimide, polyethylene terephthalate (PET), or the like, is applied to one surface 19a of the magnetic metal sheet 19 and is dried, thereby forming the film 17 with a thickness of about 10 μm to about 30 μm that is permeated by visible light.

Thereafter, as illustrated in FIG. 3B, a resist is applied to the other surface 19b of the magnetic metal sheet 19, for example, by spraying, and is dried so as to form a resist film. Subsequently, the resist film is exposed by using a photomask, and then is developed so as to form a resist mask 21 having multiple openings 20 with a shape and dimensions that are greater than those of the multiple thin film patterns at positions corresponding to the thin film patterns.

Subsequently, as illustrated in FIG. 3C, the magnetic metal sheet 19 is subjected to wet etching by using the above-described resist mask 21, the magnetic metal sheet 19 in parts that correspond to the openings 20 of the resist mask 21 is removed so as to form the through holes 14, thereby forming the magnetic metal member 15. Thereafter, the resist mask 21 is removed by being dissolved into an organic solvent, for example. Thereby, the mask member 7 including the magnetic metal member 15 and the resin film 17, contacting tightly with each other, is formed. An etchant for etching the magnetic metal sheet 19 can be selected appropriately according to the material used for the magnetic metal sheet 19, and a known technique can be applied.

Furthermore, when etching the magnetic metal sheet 19 so as to form the through holes 14, the mask-side alignment mark 18 for positioning a substrate-side alignment mark, which is provided in advance at a predetermined position outside a formation region of the multiple through holes 14 on the substrate, may be formed at the same time. In this case, when forming the resist mask 21, an opening for the alignment mark may be preferably provided at a position corresponding to the mask-side alignment mark 18.

Next, a process of forming a mark that has a specified shape and a specified depth by irradiating a part of the film 17 through the through holes 14 of the mask member 7 with the laser beams L will be described.

Figure 4A:
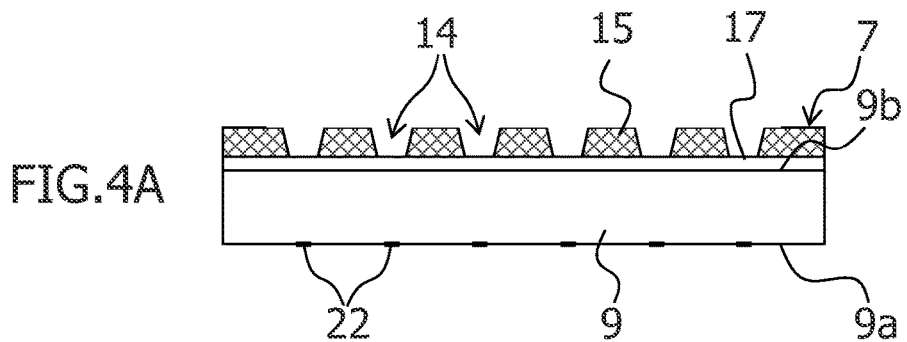
FIGS. 4A to 4C are explanatory views that illustrate an intermediate process of the production method for the deposition mask of the present invention.
Figure 4B:
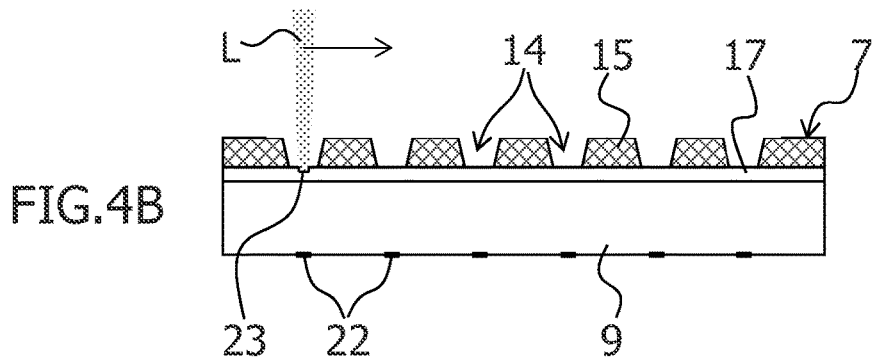
Figure 4C:
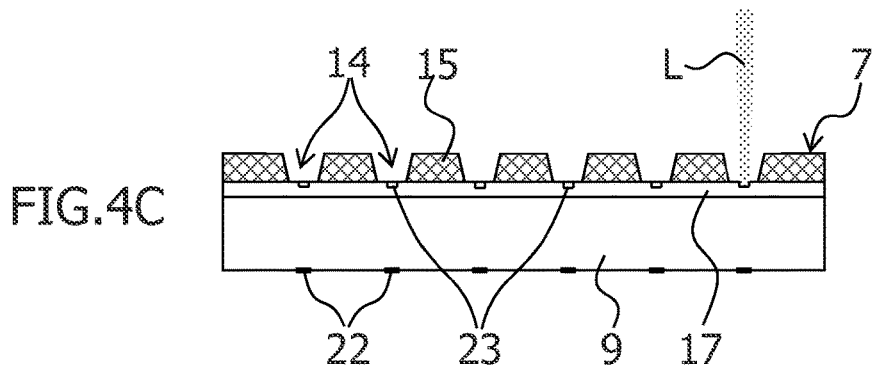

FIG. 4A to 4C are explanatory views that illustrate a process of forming the mark serving as a formation target of the opening pattern.

First, as illustrated in FIG. 4A, a surface of the film 17 of the mask member 7 is allowed to contact tightly with the other surface 9b of the reference substrate 9 that is a transparent substrate and has reference patterns 22 formed on one surface 9a thereof, so that the mask member 7 and the reference substrate 9 are unified. At this time, while monitoring, by a microscope, the mask-side alignment mark 18 of the magnetic metal member 15 and the substrate-side alignment mark provided on the reference substrate 9 in advance, positions thereof are determined so that both of the marks may have a specified positional relationship (for example, in a manner such that both of the marks are centered on each other).

Thereafter, the thus unified mask member 7 and reference substrate 9 are placed on the X-Y stage 1 so that the reference substrate 9 is arranged on the stage side. The illumination device 6 is turned on, so as to illuminate the image forming position of the object lens 3 and its vicinity region, and at the same time, the imaging device 5 is started up and acquires an image at the image forming position of the object lens 3.

Subsequently, the X-Y stage 1 is moved in the X and Y directions so that the through hole 14 positioned at, for example, a left upper corner of the magnetic metal member 15 illustrated in FIG. 2A, is positioned below the object lens 3. Then, while monitoring by the imaging device 5, a focus of the object lens 3 is adjusted by moving the object lens 3 vertically so that an image of the reference pattern 22 of the reference substrate 9 can be seen clearly. Thereafter, the image of the reference pattern 22 is processed, and the X-Y stage 1 is adjusted by fine adjustments so that the reference pattern 22 can be centered on a field of view of the object lens 3. At this time, as the mask 4 of the laser machining apparatus, the second mask 4B is attached, and the second through hole is centered on the optical axis of the optical system of the laser machining apparatus.

When the detection of the reference pattern 22 has been completed, the object lens 3 is raised, and the focus point of the object lens 3 is positioned on the surface of the film 17. At this time, a positional displacement amount of the object lens 3 in the X and Y directions is measured by the second laser interferometer 11. Then, while measuring a movement amount of the stage by a first laser interferometer 8, the X-Y stage 1 is adjusted by fine adjustments so as to correct the positional displacement amount of the object lens 3.

Next, the laser device 2 is started up and emits the laser beams L so that the second mask 4B is irradiated with the laser beams L. The laser beams L passing through the second mask 4B are shaped by the second through hole of the second mask 4B so that a cross section thereof perpendicular to the optical axis has a shape that is similar to an external shape of the mark serving as the formation target of the opening pattern 16, and then, the laser beams L pass through the imaging lens 10 and the object lens 3, and are concentrated onto the film 17. Thus, the second through hole is projected in reduced size onto the film 17 by the imaging lens 10 and the object lens 3, whereby the above-described mark 23 is formed on a part of the film 17 that corresponds to the reference pattern 22, as illustrated in FIG. 4B. In this case, when the opening pattern 16 is formed by multiple shots (for example, 25 shots) of the laser beams L, the number of shots for forming the mark 23 is less than that for forming the opening pattern 16, such as two shots. Thus, in the film 17, a shallow concave part (scratch), serving as the above-described mark 23, is formed.

When the opening pattern 16 is formed by one shot of the laser beams L, the mark 23 may be preferably formed with the laser beams L with irradiation energy lower than that of the laser beams L for forming the opening pattern 16.

Thereafter, based on a designed value of the array of the multiple opening patterns 16 to be formed, the X-Y stage 1 is moved by step from a machining start position in the X and Y directions (for example, in a direction opposite to an arrow in FIG. 4B), and the mark 23 is formed at a predetermined position in each of the through holes 14 of the magnetic metal member 15, as illustrated in FIG. 4C. Then, when the formation of all of the marks 23 is completed, the X-Y stage 1 is returned to the machining start position.

Next, a process of laser beam machining of the opening pattern 16 that penetrates the film 17 will be described.

Figure 5A:
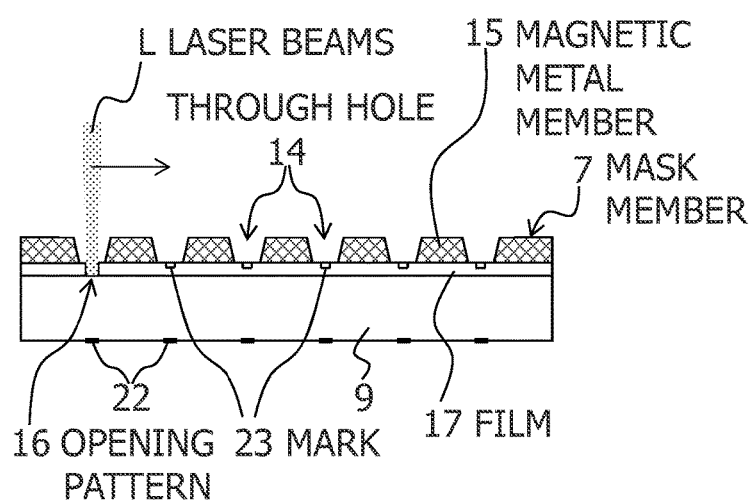
FIGS. 5A and 5B are explanatory views that illustrate a post process of the production method for the deposition mask of the present invention.
Figure 5B:
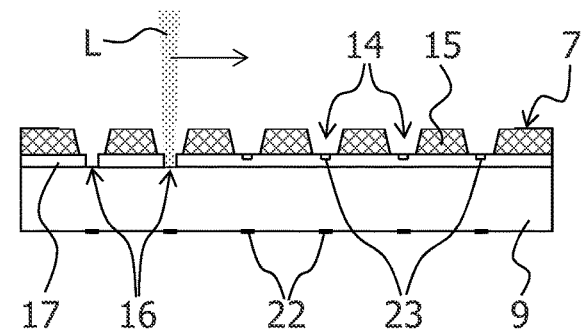

FIGS. 5A and 5B are explanatory views that illustrate the process of the laser beam machining of the opening pattern 16.

First, the second mask 4B of the laser machining apparatus is replaced with the first mask 4A, and the first through hole of the first mask 4A is centered on the optical axis of the optical system of the laser machining apparatus.

Subsequently, the mark 23 at the machining start position is detected by the imaging device 5, and the X-Y stage 1 is adjusted by fine adjustments so that the mark 23 is centered on the field of view of the object lens 3. After finishing the adjustment, the laser device 2 is started up and emits, for example, 25 shots of the laser beams L for forming the opening pattern 16. The laser beams L are shaped by the first through hole of the first mask 4A so that the cross section thereof perpendicular to the optical axis has a shape similar to that of the opening pattern 16, and the laser beams L are projected in reduced size onto the film 17 by the imaging lens 10 and the object lens 3. Thus, as illustrated in FIG. 5A, the initial opening pattern 16 is formed, penetrating the film 17, on the part of the film 17 that corresponds to the mark 23.

When the formation of the initial opening pattern 16 has been completed, the X-Y stage 1 is moved by step in an opposite direction to an arrow illustrated in FIG. 5B by the same distance as the array pitch (the designed value) of the opening patterns 16, so that the object lens 3 is positioned above an adjacent mark 23 adjacent to the mark 23 at the machining start position. In this case, by the impact of the laser beam machining of the initial opening pattern 16, the mask member 7 may be partially risen, and the position of the mark 23 may be displaced. Then, in the embodiment of the present invention, before subjecting the second opening pattern 16 to the laser beam machining, the second mark 23 formed on the film 17 is imaged and detected by the imaging device 5, and the position of the X-Y stage 1 is adjusted by fine adjustments so that the mark 23 is centered on the field of view of the object lens 3.

After correcting the displacement of the mark 23 as described above, the laser device 2 is started up, and the mark 23 is irradiated with multiple shots of the laser beams L, to thereby subject the second opening pattern 16 to the laser beam machining, as illustrated in FIG. 5B.

Thereafter, while moving the X-Y stage 1 step by step in the X and Y directions (for example, in the direction opposite to the arrow in FIG. 5B), the detection of the mark 23 and the correction of the displacement of the mark 23 are carried out by the imaging device 5 each time, and then each of the opening patterns 16 is subjected to the laser beam machining by being irradiated with the laser beams L. Thus, even in a case in which the mask member 7 is partially risen due to the impact of the laser beam machining of the opening pattern 16 and the displacement is caused thereby, the mark 23 that is the formation target of the opening pattern 16 can be irradiated with the laser beams L accurately so as to form the opening pattern 16, so that the formation position precision of the opening pattern 16 can be improved.

In the above description, the case in which the one opening pattern 16 is formed in each of the through holes 14 of the magnetic metal member 15 was described, but the embodiment of the present invention is not limited thereto, and multiple opening patterns 16 may be formed in one through hole 14.

Figure 6:
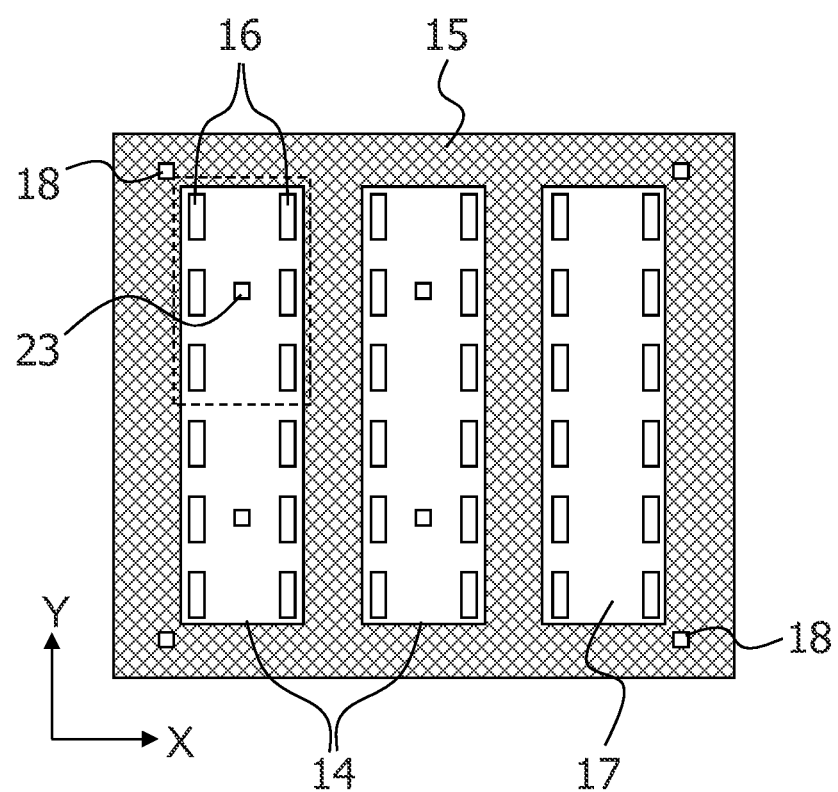
FIG. 6 illustrates a modified example of a deposition mask produced by the method of the present invention.

FIG. 6 illustrates a modified example of a deposition mask produced by the method of the present invention.

In this deposition mask, a through hole 14 provided in a magnetic metal member 15 is sized to include multiple opening patterns 16, and the multiple opening patterns 16 are formed at predetermined positions around a mark 23 as a center in the through hole 14.

The above-described deposition mask can be manufactured as follows.

First, a first mask 4A, in which multiple first through holes are provided at predetermined positions around, as a center, a position that is on the optical axis of an optical system of a laser machining apparatus, and a second mask 4B, in which a second through hole is provided so as to be centered on the optical axis, are prepared.

Next, similarly to the above, by using the second mask 4B, while a X-Y stage 1 is moved step by step in the X and Y directions by a predetermined distance, the multiple marks 23 that are shallow in depth are formed in a film 17 of a mask member 7.

Subsequently, the second mask 4B is replaced with the first mask 4A, and the mark 23 is imaged by the imaging device 5, and furthermore, the X-Y stage 1 is adjusted by fine adjustments so as to correct the displacement of the mark 23, to thereby center the mark 23 on the field of view of an object lens 3.

Thereafter, by being irradiated with laser beams L, multiple opening patterns 16 (for example, six opening patterns 16 that are surrounded by a broken line in FIG. 6) are formed at the same time at the predetermined positions around the mark 23 as the center. Then, similarly to the above, while moving the X-Y stage 1 step by step in the X and Y directions, the detection of the mark 23 and the correction of the positional displacement of the mark 23 are carried out by the imaging device 5 each time, and then, the multiple opening patterns 16 are subjected to the laser beam machining by being irradiated with the laser beams L.

Also in this case, the multiple opening patterns 16 are subjected to the machining by using the mark 23 formed in advance as a reference, and thus, the multiple opening patterns 16 can be formed with high positional precision.

Figure 7A:
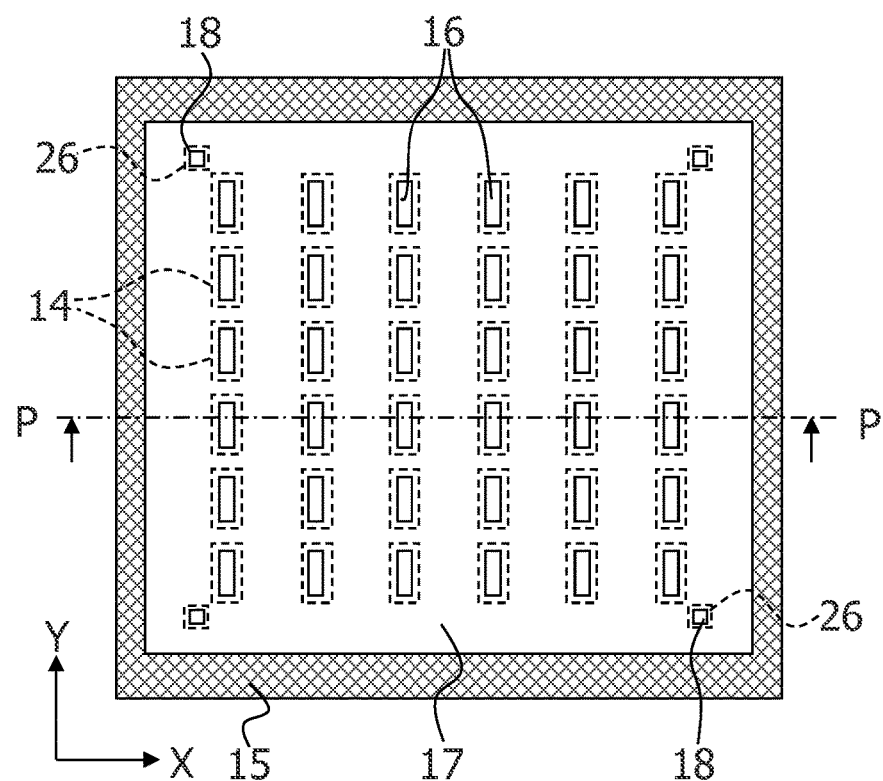
Figure 7B:
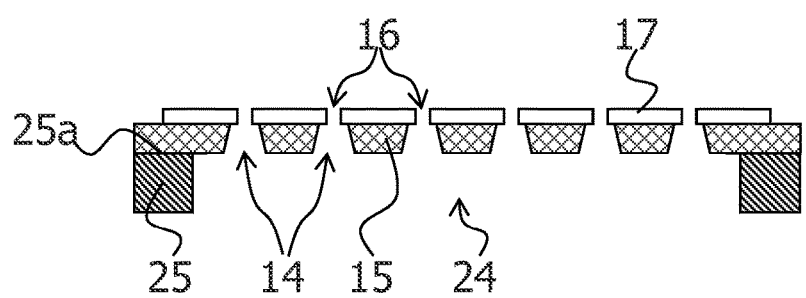

In the above description, the case in which the deposition mask is composed of the magnetic metal member 15 and the film 17 was described, but the embodiment of the present invention is not limited thereto. The deposition mask may be obtained by connecting: one end face 25a of a frame 25 having an opening 24 sized to include the multiple through holes 14 and alignment mark through holes 26 formed simultaneously with the through holes 14 of the magnetic metal member 15; with a peripheral part of the magnetic metal member 15 on a side opposite to the side on which the film 17 contacts tightly, as illustrated in FIGS. 7A and 7B. In this case, it may be preferable that the mask member 7, from which a peripheral part of the film 17 has been removed, is provided under tension on the frame 25, and the magnetic metal member 15 and the frame 25 are spot-welded, and then, the mark 23 is formed by the laser beam machining, and the opening patterns 16 are formed in the through holes 14, using the mark 23 as a reference, followed by forming the mask-side alignment marks 18 in the alignment mark through holes 26. Thus, the positions of the opening patterns 16 and the mask-side alignment marks 18 can be prevented from being displaced due to the stretching of the mask member 7 at the time when the mask member 7 is provided on the frame 25 under tension. The mark 23 and the opening patterns 16 may be formed in regular order in the X direction or the Y direction, or in a zigzag manner in the X and Y directions, while moving the X-Y stage 1 step by step.

It should be noted that the entire contents of Japanese Patent Application No. 2012-250974, filed on Nov. 15, 2012, on which convention priority is claimed, is incorporated herein by reference.

It should also be understood that many modifications and variations of the described embodiments of the invention will be apparent to one skilled in the art without departing from the spirit and scope of the present invention as claimed in the appended claims.

What is claimed is:

1. A production method for a deposition mask, the deposition mask comprising:
    a resin film in which multiple opening patterns each having a shape and dimensions that are the same as those of a corresponding one of multiple thin film patterns to be formed in a substrate are formed at positions corresponding to the multiple thin film patterns; and a sheet magnetic metal member in which multiple through holes each sized to include the corresponding opening pattern are formed, the magnetic metal member contacting tightly with the resin film, the production method comprising the sequential steps of:

forming a mask member having a structure in which the magnetic metal member having the through holes and the resin film before forming the opening patterns, contact tightly with each other;

placing the mask member and a reference substrate on a stage of a laser machining apparatus with the resin film of the mask member contacting tightly with the reference substrate, the reference substrate having a reference pattern, the laser machining apparatus including a first mask in which multiple first through holes for forming the opening patterns are provided at predetermined positions around, as a center, an optical axis of the laser machining apparatus, and a second mask in which a second through hole for forming a mark having a specified shape and a specified depth is provided so that the second through hole is centered on the optical axis;

using an imaging device included in the laser machining apparatus to image the reference pattern and centering the reference pattern on the optical axis;

forming the mark by irradiating a part of the film through a corresponding one of the through holes of the mask member with a laser beam using the second through hole of the second mask, the part being positioned correspondingly to that of the reference patterns of the reference substrate;

using the imaging device to image the mark and centering the mark on the optical axis; and forming, at the same time, the opening patterns that penetrate the film by irradiating predetermined positions around the mark as a center with laser beams using the first through holes of the first mask.

2. The production method for the deposition mask, according to claim 1, wherein the magnetic metal member includes multiple through holes separated by bridges and arranged in a line, multiple lines of which are provided at a specified array pitch, and wherein one opening pattern is formed in each of the through holes.

3. The production method for the deposition mask, according to claim 1, wherein multiple opening patterns are formed in one through hole.

4. The production method for the deposition mask, according to claim 1, wherein the mark is formed by shots of laser beams, the number of which is less than the number of shots of the laser beams irradiated to form the opening pattern.

5. The production method for the deposition mask, according to claim 1, wherein the mark is formed with the laser beams with irradiation energy lower than that of the laser beams for forming the opening pattern.

6. The production method for the deposition mask, according to claim 1, further comprising, between the step of forming the mask member and the step of forming the mark, the step of connecting one end face of a frame having an opening sized to include the multiple through holes of the magnetic metal member, with a peripheral part of the magnetic metal member on a side opposite to a side on which the film contacts tightly.

* * * * *